(12) United States Patent  (10) Patent No.: US 8,474,320 B2
Kordon et al.  (45) Date of Patent: Jul. 2, 2013

(54) METHOD AND APPARATUS FOR LOCATING CABLE FAULTS

(75) Inventors: Ulrich Kordon, Dresden (DE); Steffen Kuerbis, Dresden (DE); Matthias Wolff, Goerlitz (DE); Marco Kuettner, Dresden (DE); Marco Stephan, Dresden (DE); Torsten Berth, Moritzburg (DE)

(73) Assignees: Hagenuk KMT Kabelmesstechnik GmbH, Radeburg (DE); Technische Universitaet Dresden, Dresden (DE)

( * ) Notice: Subject to any disclaimer, the term of this patent is extended or adjusted under 35 U.S.C. 154(b) by 241 days.

(21) Appl. No.: 13/178,682

(22) Filed: Jul. 8, 2011

(65) Prior Publication Data

US 2012/0006117 A1   Jan. 12, 2012

(30) Foreign Application Priority Data

Jul. 10, 2010   (DE) .......................... 10 2010 026 815

(51) Int. Cl.
*G01H 1/00* (2006.01)
*G01R 31/08* (2006.01)

(52) U.S. Cl.
USPC ................................ 73/587; 73/592; 324/536

(58) Field of Classification Search
USPC ................... 73/587, 40.5, 584, 592; 324/512, 324/528, 536
See application file for complete search history.

(56) References Cited

U.S. PATENT DOCUMENTS

| 4,565,964 | A | * | 1/1986 | Matthews et al. | 324/539 |
| 4,835,478 | A | * | 5/1989 | Haddon et al. | 324/536 |
| 5,210,498 | A | * | 5/1993 | Paananen | 324/529 |
| 5,428,295 | A | * | 6/1995 | Beeman | 324/529 |
| 8,264,226 | B1 | * | 9/2012 | Olsson et al. | 324/329 |
| 2012/0105073 | A1 | | 5/2012 | Kuettner et al. | |

* cited by examiner

*Primary Examiner* — J M Saint Surin
(74) *Attorney, Agent, or Firm* — W. F. Fasse

(57) ABSTRACT

An electrical pulse fed into an electrical cable, e.g. a power transmission or distribution cable buried underground, produces an acoustic signal, e.g. an arc-over or discharge noise, at a fault in the cable. This acoustic signal is detected and used to locate the fault. But the acoustic signal has interference noise superimposed on it, which makes it difficult to identify the acoustic signal in the noise-burdened received signal, and thus also makes it difficult or impossible to accurately locate the fault. To minimize or avoid the influence of interference noises, the relevant acoustic signal is identified in the received signal by comparing the received signal with predetermined sample data, such as signal patterns, characteristics or characteristic sets.

18 Claims, 3 Drawing Sheets

METHOD AND APPARATUS FOR LOCATING CABLE FAULTS

PRIORITY CLAIM

This application is based on and claims the priority under 35 USC 119 of German Patent Application 10 2010 026 815.1, filed on Jul. 10, 2010, the entire disclosure of which is incorporated herein by reference.

FIELD OF THE INVENTION

The invention relates to a method and an apparatus for locating faults in cables, which are buried in the ground and especially serve for transmitting and distributing electrical energy. A cable fault is located by detecting and evaluating an acoustic signal that is produced at the fault and that is especially an arc-over noise or discharge noise triggered by an electrical pulse in the cable.

BACKGROUND INFORMATION

There are basically three types of cable faults, which should be distinguished from one another. A first type is a ground fault in which one or more conductors of the cable are connected with ground potential through a faulty conductive connection. A second type is a short circuit in which two or more conductors of the cable are connected with one another in a high-resistance or low-resistance manner. A third type is an interruption or break in which one or more conductors within the cable are interrupted. There are also fault modes that involve combinations of these fault types.

Locating of such faults can involve pre-locating and post-locating, or gross locating and exact locating, which should also be distinguished from one another. Pre-locating involves determining a more or less exact distance of the fault location from a cable beginning and, if applicable, an identification of the faulty cable. Post-locating involves a point-exact localization of the fault location.

Depending on the type of the cable fault, various different methods are known for the pre-locating and post-locating. An essential underlying principle of such methods is the use of reflection measurements in which an electrical pulse is fed into the cable or conductor line, propagates along the line and is then reflected at the fault location. The reflected pulse is received back at the cable end at which the pulse was fed into the line. Thereby the distance from the cable end at which the pulse was fed into the line to the fault location can be calculated based on the time duration between the infeeding of the pulse and the receiving of the reflected pulse, and therewith its transit time. Moreover, with higher energy pulses, an electrical arc-over or a sparking arc can be produced at the fault location, and this leads to an acoustic discharge noise, which can be detected or recorded by an acoustic sensor on the ground surface above the buried cable. By evaluating the varying intensity of the detected acoustic signal at different locations on the ground surface, e.g. as the acoustic sensor is moved along the ground surface, thereby the fault location can be localized. Furthermore, it is also possible to evaluate, at a measuring location, the running time or transit time of the acoustic signal and especially the time duration between the detection of the electromagnetic field produced by the electrical pulse and the detection of the acoustic signal triggered by this pulse.

In that regard it has been shown, however, that the actually received acoustic signal (hereinafter called the "received signal") not only contains the acoustic signal produced at the fault location of the cable, but rather also can contain considerable acoustic interference noises caused by e.g. environmental influences (wind, rain) or the street traffic or persons and the like. These interference noises interfere with identifying, or make it significantly more difficult to identify, the acoustic signal produced at the fault location of the cable, and thereby can impair the accuracy and efficiency of the fault locating.

SUMMARY OF THE INVENTION

In view of the above, it is an object of the invention to provide a method and an apparatus for locating cable faults by detecting and evaluating an acoustic signal produced at a fault location of the cable, which are substantially less sensitive with respect to the abovementioned or other interference noises. Thereby, it is a further object of the invention to achieve a more exact and more reliable locating of a fault in an electrical cable. The invention further aims to avoid or overcome the disadvantages of the prior art, and to achieve additional advantages, as apparent from the present specification. The attainment of these objects is, however, not a required limitation of the claimed invention.

The above objects have been achieved according to an embodiment of the invention, in a method of locating a fault at a fault location in an electrical cable that is for electrical power transmission or distribution, wherein at least the fault location of the cable is covered by a cover medium, such as being buried underground and covered with soil or the like. The embodiment of the method comprises the following steps:
a) emitting an original acoustic signal from the fault, and allowing the original acoustic signal to propagate through the cover medium from the fault location to a detection location;
b) using an acoustic sensor at the detection location, detecting a received signal that includes the original acoustic signal (but may additionally include interference);
c) comparing the received signal or a pre-processed version thereof with sample data stored in a memory, wherein the sample data comprises at least one sample data item selected from the group consisting of signal patterns, signal characteristics, signal characteristic sets, signal amplitudes, signal frequencies, signal feature sequences, signal heuristic models, signal sections, and complete signals of previously determined acoustic sample signals representative of acoustic signals emitted from sample faults in one or more sample cables;
d) based on the comparing, determining that a portion of the received signal has a correspondence or at least a predetermined similarity to at least one sample data item of the sample data, and thereby identifying the portion as the original acoustic signal included in the received signal; and
e) using at least information obtained from the portion of the received signal to enable the locating of the fault.

For example, the last step can involve determining the time delay until receiving the acoustic signal after receiving an electromagnetic signal from an electrical pulse that triggered the acoustic signal, or calculating a distance from the sensor to the fault location based on the time delay and a propagation speed of sound in the cover medium, or evaluating the amplitude or intensity of the acoustic signal, or other uses of the available information to enable locating the fault.

The above objects have further been achieved according to an embodiment of the invention in an apparatus for carrying out a method such as the inventive methods disclosed herein. The embodiment of the apparatus comprises an acoustic sensor, a memory and a comparison unit. The acoustic sensor is adapted to be arranged at the detection location and to detect the acoustic received signal that includes the original acoustic signal emitted from the fault and propagated through the cover medium to the detection location. The memory stores sample data which comprises at least one sample data item selected from the group consisting of signal patterns, signal characteristics, signal characteristic sets, signal amplitudes, signal frequencies, signal feature sequences, signal heuristic models, signal sections, and complete signals of previously determined acoustic sample signals representative of acoustic signals emitted from sample faults in one or more sample cables. The comparison unit is connected to the acoustic sensor and to the memory, is adapted to compare the received signal or a pre-processed version thereof with the sample data, and is adapted to determine that a portion of the received signal has a correspondence or at least a predetermined similarity to at least one sample data item of the sample data and thereby to identify the portion as the original acoustic signal included in the received signal.

An advantage of the inventive solution is that the subjective influences of the respective user on the detection of the acoustic signal triggered at the fault location can also be significantly reduced. Thereby the accuracy of the localization of the fault location can be significantly improved. This applies especially in connection with relatively strong external acoustic interference signals and/or a still relatively large spacing distance of the acoustic sensor from the fault location.

The inventive solution is especially suitable for the post-locating of a fault location. However, dependent on the length or the size of the applicable cable network or other circumstances, a pre-locating of the fault location can also be omitted or avoided if applicable, or the inventive solution can also be used for the pre-locating.

Particular embodiments of the invention preferably further provide additional detailed features, for example as follows. The acoustic signal may be caused or triggered by feeding or injecting an electrical pulse into the cable, whereby this electrical pulse then causes a voltage arc-over, a breakdown or breakthrough, and/or an electric arc at the fault location, which in turn triggers the acoustic signal. The fault can be located by determining a time delay between the detection of the electrical pulse fed into the cable and the detection of the acoustic signal produced at the fault location. More particularly, a distance between the location of receiving the signal and the fault location of the cable can be determined from the abovementioned time delay and the known propagation speed of the acoustic signal in the medium between the fault location and the signal receiving location (e.g. the medium may be the ground soil in which the cable may be buried). This makes it possible not only to locate the cable fault in connection with an intensity of the acoustic signal produced at the fault location, but rather also to measure a spacing distance between an apparatus according to the invention and the fault location. To achieve this, a sensor and evaluation unit of an embodiment of an apparatus according to the invention includes an electromagnetic sensor for detecting the electrical pulse as well as the acoustic sensor for detecting the acoustic received signal. An embodiment of the sensor and evaluation unit further preferably includes an analog-digital converter for digitizing both signals, a signal processor for determining the time delay between the two signals and for comparing the received signal with stored signal patterns or characteristics or characteristic sets of samples of acoustic signals produced at cable fault locations in order to thereby identify the original acoustic signal in the received signal if a correspondence or predetermined degree of similarity between the received signal and the stored data is recognized, and a display or output device for displaying or outputting the determined time delay. Therefore, the sensor and evaluation unit preferably includes a suitable memory storing the previously determined samples of signal patterns or characteristics or characteristic sets, and a suitable memory or input storing or receiving data regarding the propagation speed of the acoustic signal in the pertinent medium.

Further embodiments according to the invention preferably perform a pre-processing of the received signal, to resolve or separate it into a time sequence of signal characteristics, before the received signal or these signal characteristics are compared with the stored sample signal patterns or characteristics or characteristic sets.

BRIEF DESCRIPTION OF THE DRAWINGS

In order that the invention may be clearly understood, it will now be described in connection with example embodiments thereof, with reference to the accompanying drawings, wherein.

Figure 1:
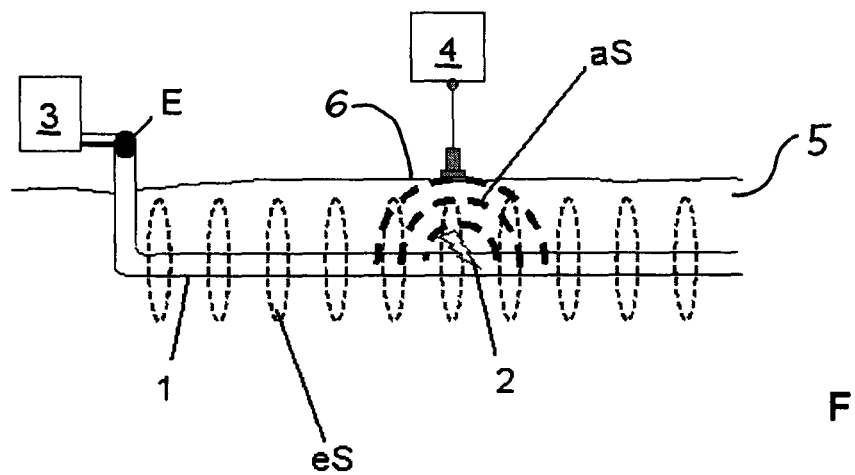
FIG. 1 schematically illustrates the principle of a basic arrangement of various components of an apparatus for acoustically locating a cable fault.

DETAILED DESCRIPTION OF PREFERRED EXAMPLE EMBODIMENTS AND OF THE BEST MODE OF THE INVENTION

For producing an acoustic signal at a fault location of a cable, an electrical signal, preferably in the form of a pulse, is fed into the cable, whereby the physical parameters (voltage, current, frequency, duration) of the electrical pulse are so dimensioned dependent on the type and the length of the cable as well as the type of the fault, such that at the fault location it produces an electrical arc-over, a break-down or breakthrough and/or a sparking arc, which triggers a discharge noise in the form of an acoustic signal with an intensity that is sufficient for the subsequently described detection.

The inventive localizing of a fault location is based on the time duration or delay between the detection of the electromagnetic signal produced by the electrical pulse and the detection of the thereby triggered acoustic signal at a location in the surroundings of the fault location. A preferably mobile sensor and evaluation unit, having both an acoustic sensor as well as an electromagnetic or magnetic field sensor, serves for the detection of the two signals and for the determination of the abovementioned time duration. The spacing distance to the fault location is thereby correspondingly smaller, the shorter this time duration is. Directly at the fault location or on the ground above the fault location, the time duration comprises a distinct minimum, which is essentially determined by the depth at which the cable is laid in the ground.

Insofar as not only the time duration and its minimum but also the actual distance of the sensor and evaluation unit to the fault location shall be determined and evaluated, the propagation velocity of the acoustic signal (i.e. sound) in the medium between the fault location and the acoustic sensor (e.g. the ground soil) is to be utilized for the calculation thereof. It should be understood, however, that the present invention is not only applicable for use in locating a fault in a cable that is buried underground in the soil. Instead, the invention is applicable for locating a cable fault that is covered by any type of medium through which the acoustic signal can propagate. In a preferred embodiment, it is simply necessary to know the propagation speed of sound in the applicable medium.

The localization of the faulty cable is possible through display or indication of the magnetic field intensity on the sensor and evaluation unit, because this magnetic field intensity is greatest at the location on the ground surface directly vertically above the cable (assuming a cable buried in the ground). Thereby, the user of the apparatus recognizes this location by noting the highest displayed magnetic field intensity. The applicable magnetic field is similarly produced by the electrical pulse that is fed into the faulty cable.

For generating the electrical pulse, for example, a surge or impulse generator can be used, which essentially comprises a high voltage source and a high power capacitor block, which is charged up to a required pulse voltage by means of the high voltage source. When the required pulse voltage (up to several 100 kV depending on the type of the cable and depending on the type of the fault) is reached, the energy stored in the capacitor block is fed through a switching system into the cable to be tested, in the form of an electrical pulse (energetic traveling wave). The pulse propagating along the cable then produces an electrical break-down or break-through, a voltage arc-over and/or a sparking arc at the fault location, and therewith triggers the acoustic signal, which propagates in the ground in which the cable is buried, and can be detected at the ground surface by means of the abovementioned sensor and evaluation unit, just like the electromagnetic signal produced by the electrical pulse.

A corresponding arrangement or apparatus for locating a cable fault is schematically illustrated in FIG. 1. A cable 1 laid or buried underground in soil 5 or the like comprises a fault at a fault location 2 to be determined. Alternatively, the cable 1 need not be buried in soil, but can be covered by any other cover medium making the fault location inaccessible. The cover medium may include any one or more of soil, rock, concrete, asphalt, building materials, water, etc.

The cable 1 is connected at a feed-in location E with a surge or impulse generator 3, with which an electromagnetic signal eS, preferably in the form of an electromagnetic pulse, is fed into the cable 1. Along or in the surroundings of the cable, on the ground surface 6, there is located a sensor and evaluation unit 4, which includes an electromagnetic (magnetic field) sensor and an acoustic sensor, which respectively serve to detect the electrical pulse eS and the acoustic signal aS triggered by the electrical pulse at the fault location 2. The sensor and evaluation unit 4 further includes circuit components that serve to calculate the time duration between the reception of the two signals eS and aS as will be discussed further below.

Figure 2:
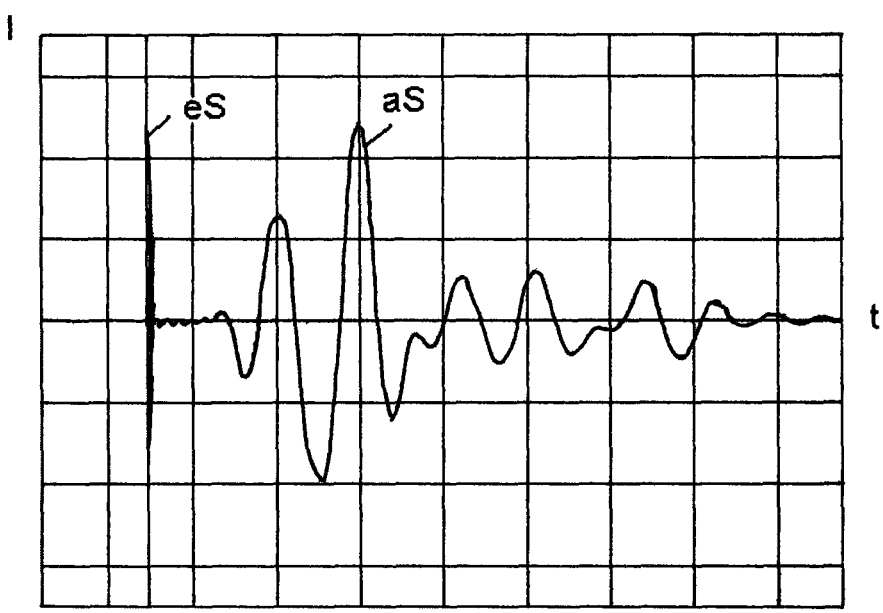
FIG. 2 is a diagram of signal intensity I versus time t, showing a time progression of a received acoustic signal in relation to a received electromagnetic signal.

A typical time progression of these two signals eS and aS is schematically illustrated in the diagram of FIG. 2, whereby the time t is recorded on the horizontal axis and the signal amplitude or intensity I is recorded on the vertical axis. The electromagnetic pulse eS has, in comparison to the acoustic signal aS, a very short time duration and a relatively high amplitude, while the acoustic signal aS typically comprises one or two maximum value oscillations and then decays relatively quickly.

The measurement of the time duration begins upon the detection of the electromagnetic pulse eS and ends preferably with the detection of a defined value or a defined amplitude of the acoustic signal aS.

As has already been explained in detail initially, acoustic interference noises, which especially arise directly after the electromagnetic pulse, are superimposed on the original acoustic signal triggered by the electromagnetic pulse at the cable fault location, and thereby adulterate the original acoustic signal and form a composite acoustic signal that is actually received by the acoustic sensor of the sensor and evaluation unit 4. The composite acoustic signal as received by the acoustic sensor, i.e. the "received signal", thus includes both the original relevant acoustic signal as well as any acoustic interference noises. This can impair or make impossible the detection, in the composite received signal, of the original acoustic signal produced at the fault location. This is especially the case when the sensor and evaluation unit 4 is still located at a relatively great distance from the fault location and/or the acoustic interference noises are very intensive, because in these cases errors can arise especially in connection with the signal measurement by means of amplitude referenced trigger thresholds.

Therefore, according to an embodiment of the invention, the composite acoustic signal (which represents a mixture of the original acoustic signal produced at the fault location and the interference noises, and which is designated as the "received signal" herein as mentioned above), is recorded with the sensor and evaluation unit 4, and is then examined with regard to the occurrence of certain signal patterns or characteristics or characteristic sets, which are typical for an acoustic signal produced at a fault location of a cable, in order to in this manner identify or isolate, in the recorded received signal, the original acoustic signal produced at the fault location. Once the original acoustic signal has been accurately identified within the composite interference-burdened received signal, then this original acoustic signal is used for marking the end of the time duration or time delay between reception of the electromagnetic signal and reception of the acoustic signal. That information allows the fault to be located, e.g. by calculating a distance based on this time delay.

The sample signal patterns, characteristics or characteristic sets can especially contain or represent samples of certain acoustic signal amplitudes or signal frequencies or other signal parameters, or can also arise in certain combinations and in a certain time sequence. These signal patterns, characteristics or characteristic sets that are typical for the acoustic signal produced at a cable fault location are influenced or determined e.g. by the physical parameters of the electromagnetic signal that triggers the acoustic signal at the fault location, as well as the type of the cable and the type of the fault. Samples of such signal patterns, characteristics or characteristic sets can be previously determined by experimentally testing samples of the relevant cable or similar cables with different examples of faults therein, or can be determined by simulation or from previous empirical data. The predetermined sample data are then stored for later use in one or more memories of the sensor and evaluation unit 4.

Figure 3:
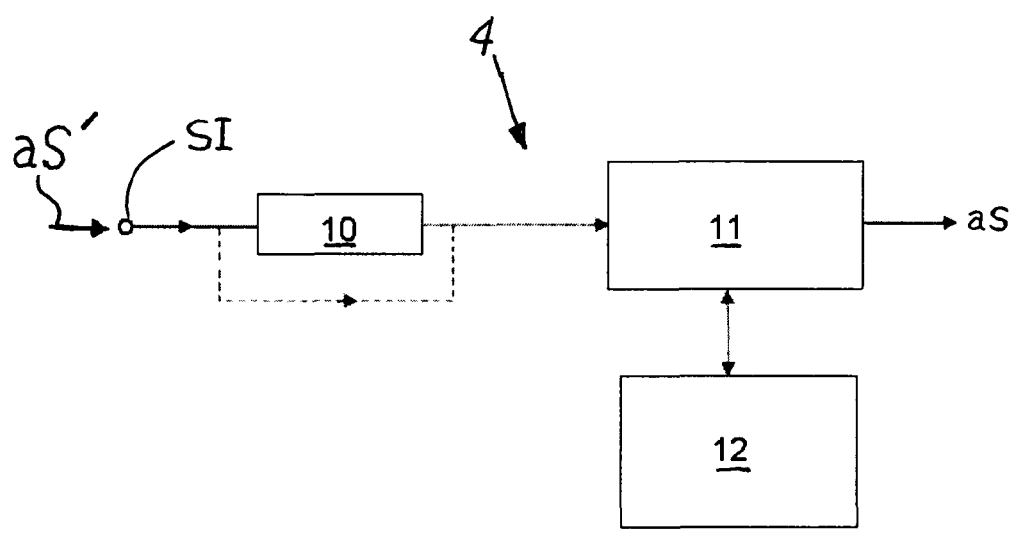
FIG. 3 is a basic block circuit diagram of an embodiment of an evaluation unit of an apparatus according to the invention.

The principle of the recognition or identification of the signal patterns as well as the essential components of a corresponding apparatus or circuit arrangement (which is preferably part of the sensor and evaluation unit 4) are schematically illustrated in FIG. 3.

The received signal aS' that is recorded or detected with the acoustic sensor of the sensor and evaluation unit 4 is present at a sensor input SI. This received signal aS' includes the original acoustic signal aS emitted by the discharge noise at the fault 2 of the cable 1, as well as acoustic interference noise as explained above. The signal aS' is thus a mixed or composite input signal, which is supplied to an analyzer 10, with which it is separated or transformed into a time sequence of individual signal patterns, characteristics or characteristic sets of the abovementioned type, which are characteristic of the original acoustic signal aS produced at the fault location 2, but also include characteristics of the superimposed acoustic interference signals. These actual signal patterns, characteristics or characteristic sets are then supplied to a comparison unit 11, which is connected with a memory 12.

Sample signal patterns, characteristics or characteristic sets, which, according to the above explanation, have previously been determined as being typical or representative of example acoustic signals produced at example faults in example cables, are stored in the memory 12. Alternatively or additionally thereto, it is also possible to store the typical sample signal patterns in the form of models, functions or equations, for example preferably heuristic models, which are determined e.g. in a learning process with suitable test signals. Such models or signal patterns are previously determined in tests using test sample cables with typical sample faults. Such models or other signal patterns can also still be fine-tuned or learned during the use of the sensor and evaluation unit. Namely, as the sensor and evaluation unit, or the sensors thereof, are moved to successive locations and the signal acquisition and evaluation is repeated so as to more finely locate or localize the fault location on a cable, the successive received signals can be analyzed for consistently occurring signal portions, which are taken to likely represent the original acoustic signal, while signal portions that differ among successive measurements are taken to represent interference noises. For this purpose, methods can be used as they are known e.g. in the field of automatic speech recognition.

In the comparison unit 11, the actual signal patterns, characteristics or characteristic sets of the received signal aS' are examined with regard to the occurrence of, or correspondence with, the previously determined sample signal patterns, characteristics or characteristic sets that are read out of the memory 12. This occurs preferably in the course of the determination of a similarity or a measure of correspondence between the sample signal pattern or patterns etc. that are read out of the memory 12, and the actual signal patterns etc. of sections of the received signal, with the goal being to determine what portion of the received signal has the greatest similarity with one of the sample signal patterns etc. that are read out of the memory 12. Such portion of the received signal is thereby determined to be or represent the original acoustic signal aS included in the received signal aS'.

Figure 4:
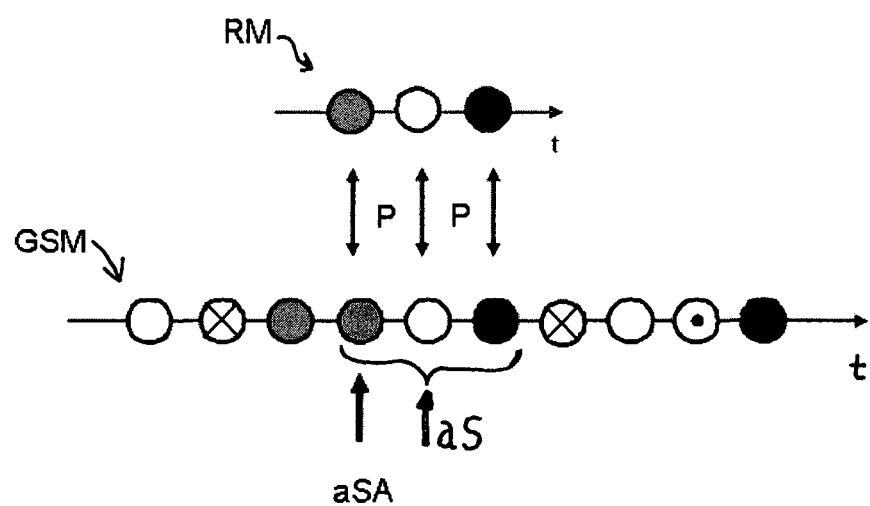
FIG. 4 is an illustration for explaining an acoustic pattern comparison according to the invention.

This principle is schematically represented in FIG. 4 along the time axis t. The input signal aS' that is supplied to the comparison unit 11 and analyzed according to above explanation is illustrated in the form of an input signal pattern GSM, which contains a sequence of characteristics or a characteristic set of the actual received signal. This pattern GSM is compared with at least one of the sample signal patterns (reference pattern RM) that is read out of the memory 12. As soon as a correspondence or at least a certain predetermined measure of similarity between the reference pattern RM and a portion or section in the input signal pattern GSM is found (this is indicated by the arrows P in FIG. 4), the beginning aSA of the acoustic signal aS triggered at the fault location is identified in the input signal. Thereby the original acoustic signal aS is identified and can be isolated from the remainder (e.g. the interference) of the received signal aS'.

In this comparison, both the correspondences of the signal characteristics in the reference pattern RM and in the actual input signal pattern GSM as well as possible non-linear time differences between the two can be taken into consideration.

As an alternative to the use of the analyzer 10 shown in FIG. 3, the analyzer 10 can be omitted if applicable, and the actual received input signal aS' in its entirety and in its original raw form, in a non-analyzed manner, can be supplied to the comparison unit 11. This alternative embodiment is indicated with dashed lines in FIG. 3. In this case, corresponding complete sample acoustic signals as they are produced at one or more sample fault locations of one or more sample cables according to the above explanation are stored as reference signals in the memory 12, and then a comparison between these two complete signals takes place in the comparison unit 11.

The two above alternatives can be carried out with analog processing of analog signals, or with digital processing of digital signals, or a combination of analog and digital aspects.

Figure 5:
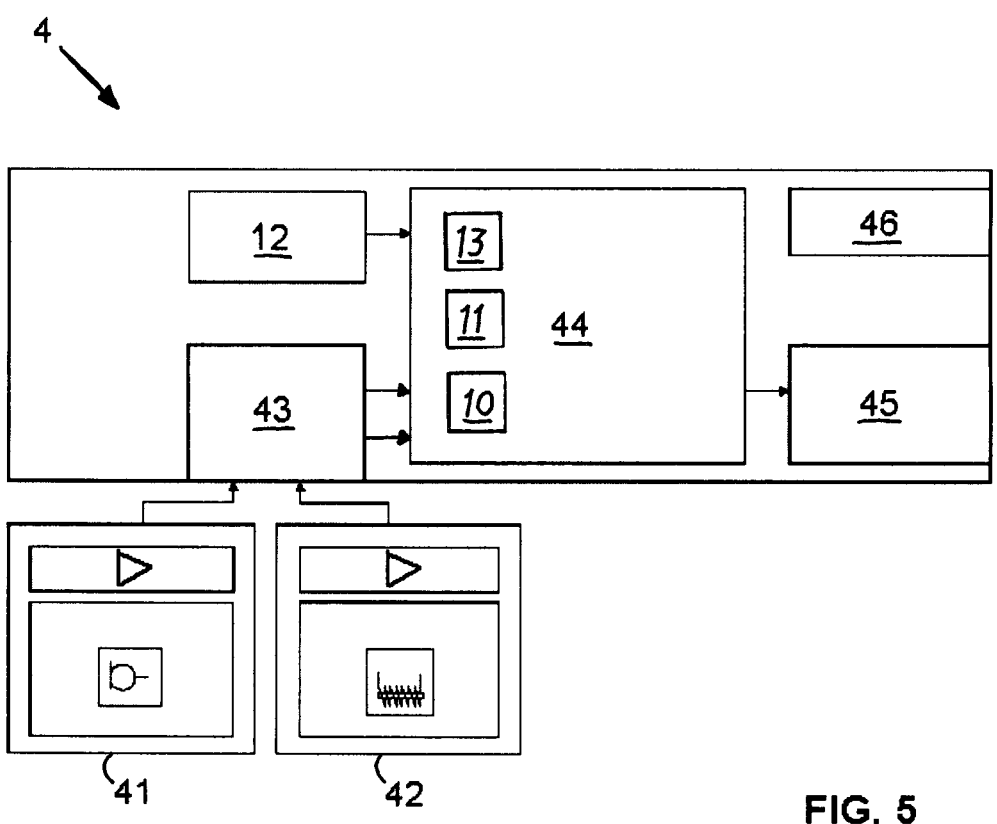
FIG. 5 is a block circuit diagram of an embodiment of a sensor and evaluation unit according to the invention.

FIG. 5 shows a block circuit diagram of a further sensor and evaluation unit 4 for carrying out the above explained methods. The sensor and evaluation unit 4 encompasses an acoustic sensor 41 for detecting the above explained acoustic input signal aS' as well as a magnetic field sensor 42 for the detection of the above explained electromagnetic signal emitted by the electrical pulse that is fed into the cable 1. Both the acoustic sensor 41 and the electromagnetic sensor 42 are arranged at a detection location on the ground surface of the soil 5. Thus, the detection location is not a single point location, but rather is large enough to accommodate both sensors and may also have some space between the sensors, which must be taken into account in the distance calculation described herein, or is simply neglected if the size of this space is negligibly small compared to the distances pertinent to the particular application. The electromagnetic signal may be a magnetic field variation or pulse caused by the electrical pulse in the cable 1, or any other electromagnetic feature that can be detected by the electromagnetic sensor, which may thus be a magnetic field sensor, for example. The two sensors 41, 42 respectively each include an amplifier and/or at least one filter for the analog amplification and/or pre-filtering of the detected sensor signals. It should thus be understood, that the term "received signal" not only refers to the acoustic signal and the electrical or optical raw signal as detected and electrically or optically reproduced by the respective sensor, but rather also refers to any further processed version of such a raw signal, e.g. after filtering, amplifying, digitizing, sampling, and/or analyzing the sample as disclosed herein, or otherwise pre-processing the raw signal.

The sensor and evaluation unit 4 furthermore comprises an analog/digital converter 43, a digital signal processor 44, the memory 12, a display or output device 45 as well as a power supply 46 (which powers the various components through conductors that are not shown in the drawing for the sake of clarity and simplicity). The amplified and pre-filtered analog sensor signals are supplied from the sensors 41 and 42 respectively via a first channel and a second channel to the analog/digital converter 43 and therewith are converted into corresponding respective digital sensor signals. The digital sensor signals are then supplied to the signal processor 44, with which essentially the functions of the analyzer 10 and of the comparison unit 11, as explained in connection with FIG. 2, are realized. For this purpose, the signal processor 44 is connected with the memory 12 that has similarly been explained in connection with FIG. 2. In other words, the signal processor 44 is one possible example of a digital embodiment of the analyzer 10 and the comparison unit 11 as implemented in hardware and software.

The acoustic signal aS shown in FIG. 2, which was triggered at the fault location 2 of the cable 1 by means of the electrical pulse fed into the cable, has been identified and isolated in the interference-burdened received signal aS' according to the description in connection with FIG. 3 above. Then, the portion of the received signal aS' identified as the original acoustic signal aS is further evaluated by means of the signal processor 44 to determine a time delay from the time of reception of the acoustic signal to the time of reception of the electromagnetic signal as detected with the magnetic field sensor 42. For this, the signal processor 44 further includes a timer 13 adapted to measure this time delay, which is then displayed or output by the display or output device 45. Furthermore, according to another alternative, the memory 12 additionally stores at least one value of a propagation speed at which sound propagates through the soil 5 or other cover medium that covers the cable 1. Alternatively, such a propagation speed value may be input through a suitable input device. Using the propagation speed and the time delay, the signal processor 44 calculates a distance value of the distance from the fault location 2 to the detection location at which the sensors 41 and 42 are arranged. The distance value is then displayed or output by the display or output device 45.

Moreover, the sensor and evaluation unit 4 can further be embodied so that also the strength of the detected electromagnetic field can be measured with the magnetic field sensor 42 and then displayed or output, in order to therewith identify the cable comprising the fault location or the applicable cable trace or run. By moving the unit 4 or at least the sensor 42, the user of the apparatus can see the location of the peak magnetic field strength, which is the location on the ground surface directly above the cable or cable trace being energized with the electrical pulse. Also, similarly, the user of the apparatus can determine the location with the minimum abovementioned time delay, which identifies the location directly above the fault in the cable.

The inventive recognition or identification of the original acoustic signal aS (i.e. the acoustic signal triggered at a fault location of the cable by the electrical pulse fed into the cable) in the interference-burdened received signal aS' allows the delay time of the acoustic signal relative to the electromagnetic signal to be accurately determined as discussed above. This allows the distance of the sensors from the fault location to be determined as well. However, it is also conceivable, e.g. that the acoustic received signal is evaluated only with regard to its intensity, in order to therewith localize the fault location or for example to obtain information about the type of the cable fault or about other parameters.

Finally, the inventive principle of the recognition or identification of the acoustic signal triggered at a fault location of a cable has been described above in connection with an overall method in which the acoustic signal is triggered by an electrical pulse fed into the cable, which causes a voltage arc-over, break-down or break-through and/or a sparking arc at the fault. Nonetheless, the acoustic noise does not have to be triggered or produced in this manner, but rather can alternatively be triggered or produced in any other known or future developed manner.

The term "connected" herein, when defining two components being "connected" to one another, includes the direct connection of the two components without any intervening component, and also includes the indirect connection of the two components with one or more other components connected therebetween.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims. The abstract of the disclosure does not define or limit the claimed invention, but rather merely abstracts certain features disclosed in the application.

What is claimed is:

1. A method of locating a fault at a fault location in an electrical cable that is for electrical power transmission or distribution, wherein at least the fault location of the cable is covered by a cover medium, and wherein said method comprises:
   a) emitting an original acoustic signal from said fault, and allowing said original acoustic signal to propagate through said cover medium from said fault location to a detection location;
   b) using an acoustic sensor at said detection location, detecting a received signal that includes said original acoustic signal;
   c) comparing said received signal or a pre-processed version thereof with sample data stored in a memory, wherein said sample data comprises at least one sample data item selected from the group consisting of signal patterns, signal characteristics, signal characteristic sets, signal amplitudes, signal frequencies, signal feature sequences, signal heuristic models, signal sections, and complete signals of previously determined acoustic sample signals representative of acoustic signals emitted from sample faults in one or more sample cables;
   d) based on said comparing, determining that a portion of said received signal has a correspondence or at least a predetermined similarity to at least one said sample data item of said sample data, and thereby identifying said portion as said original acoustic signal included in said received signal; and
   e) using at least information obtained from said portion of said received signal to enable said locating of said fault.

2. The method according to claim 1, wherein said electrical cable is buried in the ground, said cover medium comprises soil of the ground, and said detection location is a location on a ground surface of the ground.

3. The method according to claim 1,
   wherein said received signal further includes acoustic interference noise superimposed on or mixed with said original acoustic signal, and
   wherein said identifying of said portion of said received signal as said original acoustic signal comprises recognizing said portion as said original acoustic signal based on said correspondence or said predetermined similarity, and isolating said portion from a remainder of said received signal.

4. The method according to claim 1, further comprising pre-processing said received signal by separating said received signal into a sequence of signal features, wherein said pre-processed version of said received signal comprises said sequence of said signal features, and wherein said comparing comprises comparing said signal features with said sample data.

5. The method according to claim 4, wherein said pre-processing further comprises digitizing said received signal or said sequence of said signal features, and wherein said comparing, said determining and said evaluating are each respectively carried out digitally.

6. The method according to claim 1, further comprising moving said acoustic sensor to another detection location, and repeating said emitting, said detecting, said comparing, said determining and said evaluating with regard to said acoustic sensor located at said another detection location, to enable more precisely locating said fault.

7. The method according to claim 1, further comprising producing said sample data in a self-learning process of iteratively repeating said emitting, said detecting, and said comparing in plural repetition cycles, providing as said sample data at least one said sample data item of said received signal that remains substantially consistent among said plural repetition cycles, and storing said sample data in said memory.

8. The method according to claim 1, further comprising producing said sample data by conducting tests using test samples of electrical cables and recording sample acoustic signals emitted from sample faults in said test samples of electrical cables, providing said sample acoustic signals as said sample data, and storing said sample data in said memory.

9. The method according to claim 1, further comprising feeding into said cable an electrical pulse that causes a voltage discharge, arc-over, breakdown, breakthrough and/or electric sparking arc at said fault, which causes said emitting of said original acoustic signal from said fault.

10. The method according to claim 9,
wherein said electrical pulse further causes an electromagnetic signal to be emitted from said cable and propagated through said cover medium,
wherein said using of said information obtained from said portion of said received signal comprises determining a time point at which said original acoustic signal included in said received signal is received by said acoustic sensor, and
further comprising detecting said electromagnetic signal using an electromagnetic sensor at said detection location, measuring a time delay between said detecting of said electromagnetic signal and said time point, and further using said time delay to enable said locating of said fault.

11. The method according to claim 10,
further comprising providing a propagation speed at which sound propagates in said cover medium, and
wherein said using of said time delay comprises determining, based on said time delay and said propagation speed, a distance between said fault location and said detection location.

12. An apparatus for locating a fault at a fault location in an electrical cable that is for electrical power transmission or distribution, wherein at least the fault location of the cable is covered by a cover medium, and wherein said apparatus comprises:
an acoustic sensor configured to be arranged at a detection location and to detect an acoustic received signal that includes an original acoustic signal emitted from the fault and propagated through the cover medium to the detection location;
a memory storing sample data which comprises at least one sample data item selected from the group consisting of signal patterns, signal characteristics, signal characteristic sets, signal amplitudes, signal frequencies, signal feature sequences, signal heuristic models, signal sections, and complete signals of previously determined acoustic sample signals representative of acoustic signals emitted from sample faults in one or more sample cables; and
a comparison unit connected to said acoustic sensor and to said memory, wherein said comparison unit is configured to compare the received signal or a pre-processed version thereof with the sample data, and is configured to determine that a portion of the received signal has a correspondence or at least a predetermined similarity to at least one sample data item of the sample data and thereby to identify the portion as the original acoustic signal included in the received signal.

13. The apparatus according to claim 12, comprising a sensor and evaluation unit which includes said acoustic sensor, said memory and said comparison unit as components of said sensor and evaluation unit.

14. The apparatus according to claim 12, further comprising an electrical pulse generator configured to feed into the cable an electrical pulse that causes a voltage discharge, arc-over, breakdown, breakthrough and/or electric sparking arc at the fault, which causes emission of the original acoustic signal from the fault.

15. The apparatus according to claim 12, further comprising
an electromagnetic sensor configured to be arranged at the detection location and to detect an electromagnetic signal emitted from the cable due to an electrical pulse in the cable which causes emission of the original acoustic signal from the fault; and
a timer connected to said electromagnetic sensor and said comparison unit, and configured to measure a time delay between detection of the electromagnetic signal and a time point at which the original acoustic signal included in the received signal is received by the acoustic sensor.

16. The apparatus according to claim 15, further comprising
a digital signal processor incorporating said comparison unit and said timer;
at least one analog/digital converter connected between said acoustic sensor and said digital signal processor and between said electromagnetic sensor and said digital signal processor, said at least one analog/digital converter being configured to respectively digitize the acoustic received signal and the electromagnetic signal; and
a display or output device that is connected to at least one output of said digital signal processor, and that is configured to display or output the time delay.

17. The apparatus according to claim 16,
wherein said memory further stores a propagation speed at which sound propagates in the cover medium,
wherein said digital signal processor is further configured to determine, based on the time delay and the propagation speed, a distance between the fault location and the detection location, and
wherein said display or output device is further configured to display or output the distance.

18. The apparatus according to claim 12, further comprising an analyzer that is connected between said acoustic sensor and said comparison unit, and that is configured to prepare the pre-processed version of the received signal by analyzing and separating the received signal into a sequence of signal features that is provided to the comparison unit as the pre-processed version of the received signal.

* * * * *